(12) United States Patent
Ladhani et al.

(10) Patent No.: US 12,176,858 B2
(45) Date of Patent: Dec. 24, 2024

(54) THREE-WAY COMBINED RF POWER AMPLIFIER ARCHITECTURE

(71) Applicant: Renesas Electronics America Inc., Milpitas, CA (US)

(72) Inventors: Hussain Hasanali Ladhani, San Diego, CA (US); Ramanujam Srinidhi Embar, Gilbert, AZ (US); Michael Guyonnet, Velizy (FR); Tushar Sharma, Chandler, AZ (US); Shishir Ramasare Shukla, Karnataka (IN)

(73) Assignee: Renesas Electronics America Inc., Milpitas, CA (US)

( * ) Notice: Subject to any disclaimer, the term of this patent is extended or adjusted under 35 U.S.C. 154(b) by 523 days.

(21) Appl. No.: 17/511,913

(22) Filed: Oct. 27, 2021

(65) Prior Publication Data

US 2023/0128387 A1  Apr. 27, 2023

(51) Int. Cl.
*H03F 1/02* (2006.01)
*H03F 3/195* (2006.01)
*H03F 3/24* (2006.01)

(52) U.S. Cl.
CPC ........... *H03F 1/0288* (2013.01); *H03F 3/195* (2013.01); *H03F 3/245* (2013.01); *H03F 2200/318* (2013.01); *H03F 2200/451* (2013.01)

(58) Field of Classification Search
CPC ........ H03F 1/0288; H03F 3/195; H03F 3/245; H03F 2200/318; H03F 2200/451; H03F 1/565; H03F 2200/222; H03F 3/213; H03F 3/211

USPC ................ 330/295, 124 R, 286, 84
See application file for complete search history.

(56) References Cited

U.S. PATENT DOCUMENTS

| 11,936,342 | B2 * | 3/2024 | Marbell ............... H03F 1/0288 |
| 2003/0201833 | A1 | 10/2003 | Pengelly et al. |
| 2021/0075374 | A1 | 3/2021 | Wang et al. |
| 2021/0152130 | A1 | 5/2021 | Srinidhi Embar et al. |

OTHER PUBLICATIONS

Extended European Search Report dated Mar. 28, 2023 received in European Patent Application No. EP 22203099.1.

* cited by examiner

*Primary Examiner* — Hieu P Nguyen
(74) *Attorney, Agent, or Firm* — SCULLY, SCOTT, MURPHY & PRESSER, P.C.

(57) ABSTRACT

Systems and methods for amplifying a signal is described. A circuit may convert an input radio frequency (RF) signal into a first RF signal with power level matching a power capacity of a first transistor of a first size in a carrier amplifier stage, a second RF signal with power level matching a power capacity of a second transistor of the first size in a peaking amplifier stage, and a third RF signal with third power level matching a power capacity of a third transistor of a second size in another peaking amplifier stage. The circuit may amplify the first, second, and third RF signals to generate first, second, and third amplified RF signals, respectively. The circuit may combine the first, second, and third amplified RF signals, into an output RF signal that is an amplified version of the input RF signal.

20 Claims, 8 Drawing Sheets

THREE-WAY COMBINED RF POWER AMPLIFIER ARCHITECTURE

TECHNICAL FIELD

The present disclosure relates in general to apparatuses and systems for wireless power transmission. In particular, the present disclosure relates to radio frequency (RF) power amplifiers.

BACKGROUND

Wireless communication systems may employ power amplifiers for increasing the power of radio frequency (RF) signals. In a wireless communication system, a power amplifier in a final amplification stage of a transmission channel may facilitate amplification of a signal to an antenna for radiation over the air. High gain, high linearity, stability, and a high level of power-added efficiency are characteristics of a desirable amplifier in such a wireless communication system. In general, a power amplifier may operate at maximum power efficiency when the power amplifier transmits close to saturated power. However, power efficiency may degrade as output power decreases. Therefore, a high efficiency power amplifier architecture may be desirable for current and next-generation wireless systems.

However, various architectures face challenges in terms of semiconductor package design. For example, some amplifier semiconductor package designs may need distinct sets of discrete components such as devices, conductors, and integrated circuits to implement each amplification path. These distinct sets of discrete components may be maintained at specific distances apart from one another to limit potential performance degradation that may occur due to signal coupling between the different amplification paths. Therefore, it may be a challenge to design a power amplifier of a relatively small size while maintaining a distance between the different amplification paths.

To design a power amplifier with a smaller size, Gallium Nitride (GaN) devices are considered. GaN devices may provide various advantages over devices of other materials, such as providing compact size, higher power density, higher efficiency, lower switching losses, and better thermal management. GaN devices belong to a family of semiconductors known as wide-band-gap semiconductors. Wide-band-gap semiconductors may be referred to as materials with bandgaps significantly greater than those of commonly used materials, such as, for example, silicon (Si) or gallium arsenide (GaAs). A wide bandgap typically refers to a material with bandgap of greater than, for example, 1 or 2 electron volts (eV), and GaN has a bandgap of 3.2 electron volts (eV) (nearly three times higher than that of silicon). The wider bandgap allows GaN devices to require more energy for exciting a valence electron into the conduction band of the semiconductor, providing an advantage of allowing larger breakdown voltages and greater thermal stability at higher temperatures. Further, GaN's higher breakdown voltage allows GaN devices to support high voltage and high power applications without being damaged, allowing GaN devices to be used in power applications while maintaining a relatively smaller footprint. Therefore, power amplifiers based on GaN devices may have amplification paths that are closer together, resulting in a smaller power amplifier. For radio frequency applications, GaN has an electron mobility that may be significantly higher than, for example, silicon. As a result, the electrons in GaN crystals can move over 30% faster than in silicon. Thus, GaN's electron mobility allows GaN to handle higher switching frequencies in specific applications, such as RF applications.

SUMMARY

In some examples, an apparatus for amplifying a signal is generally described. The apparatus can include a circuit configured to convert an input radio frequency (RF) signal into a first RF signal, a second RF signal, and a third RF signal. The apparatus can further include a carrier amplifier stage including a first transistor of a first size. The first RF signal can have a first power level that matches a power capacity of the first transistor, and the carrier amplifier stage can be configured to amplify the first RF signal to generate a first amplified RF signal. The apparatus can further include a first peaking amplifier stage including a second transistor of the first size. The second RF signal can have a second power level that matches a power capacity of the second transistor, and the first peaking amplifier stage is configured to amplify the second RF signal to generate a second amplified RF signal. The apparatus can further include a second peaking amplifier stage including a third transistor of a second size different from the first size. The third RF signal can have a third power level that matches a power capacity of the third transistor, and the second peaking amplifier stage can be configured to amplify the third RF signal to generate a third amplified RF signal. The first amplified RF signal, the second amplified RF signal, and third amplified RF signal, can be combined into an output RF signal, and the output RF signal can be an amplified version of the input RF signal.

In some examples, a method for amplifying a signal is generally described. The method can include converting an input radio frequency (RF) signal into a first RF signal having a first power level that matches a power capacity of a first transistor of a first size in a carrier amplifier stage. The method can further include converting the input radio frequency (RF) signal into a second RF signal having a second power level that matches a power capacity of a second transistor of the first size in a first peaking amplifier stage. The method can further include converting the input radio frequency (RF) signal into a third RF signal having a third power level that matches a power capacity of a third transistor of a second size in a second peaking amplifier stage. The method can further include amplifying the first RF signal to generate a first amplified RF signal. The method can further include amplifying the second RF signal to generate a second amplified RF signal. The method can further include amplifying the third RF signal to generate a third amplified RF signal. The method can further include combining the first amplified RF signal, the second amplified RF signal, and third amplified RF signal, into an output RF signal that is an amplified version of the input RF signal.

In some examples, an apparatus for amplifying a signal is generally described. The apparatus can include a transmitter configured to receive an input RF signal. The apparatus can further include an amplifier connected to the transmitter. The amplifier can include a circuit configured to convert an input radio frequency (RF) signal into a first RF signal, a second RF signal, and a third RF signal. The amplifier can further include a carrier amplifier stage including a first transistor of a first size. The first RF signal can have a first power level that matches a power capacity of the first transistor. The carrier amplifier stage can be is configured to amplify the first RF signal to generate a first amplified RF signal. The amplifier can further include a first peaking amplifier stage including a second transistor of the first size. The second RF signal can have a second power level that matches a power capacity of the second transistor. The first peaking amplifier stage can be configured to amplify the second RF signal to generate a second amplified RF signal. The amplifier can further include a second peaking amplifier stage including a third transistor of a second size different from the first size. The third RF signal can have a third power level that matches a power capacity of the third transistor. The second peaking amplifier stage can be configured to amplify the third RF signal to generate a third amplified RF signal. The first amplified RF signal, the second amplified RF signal, and third amplified RF signal, can be combined into an output RF signal, and the output RF signal can be an amplified version of the input RF signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
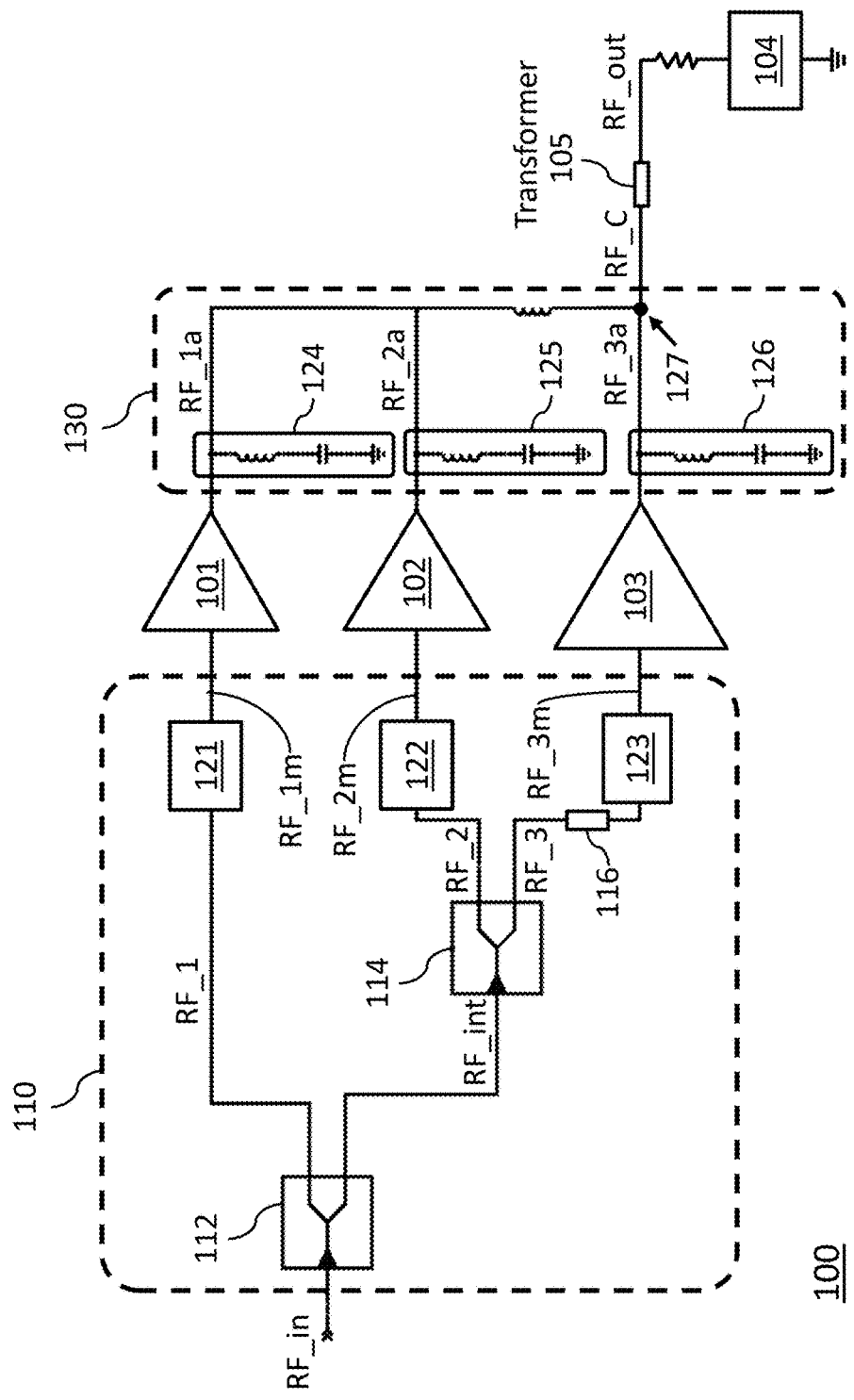
FIG. 1 is a diagram showing an example apparatus that can implement three-way combined RF power amplifier architecture in one embodiment.

FIG. 1 is a diagram showing an example apparatus 100 that can implement three-way combined RF power amplifier architecture in one embodiment. The apparatus 100 may be a power amplifier having at least three amplifier stages. In the example shown in FIG. 1, the apparatus 100 may include a carrier (or main) amplifier stage 101, a peaking (or auxiliary) amplifier stage 102, and a peaking (or auxiliary) stage 103. The apparatus 100 may further include a circuit 110 and a circuit 130. The circuit 110 may be a circuit including splitters, matching networks, and/or other circuits and components that may implement the systems and methods being described herein. In the example shown in FIG. 1, the circuit 110 may include a splitter 112, a splitter 114, an input matching network 121, an input matching network 122, and an input matching network 123.

In an example, each one of the carrier amplifier stage 101, the peaking amplifier stage 102, and the peaking amplifier stage 103 may include one power transistor. In another example, one or more of the carrier amplifier stage 101, the peaking amplifier stage 102, and the peaking amplifier stage 103 may be a two-stage device that includes two power transistors (e.g., GaN transistors) coupled in series. In these two-stage devices, one of the transistors may function as a driver and the other transistor may function as an output amplifier transistor. In an embodiment, The amplifier stage 101 is biased as a class AB amplifier while the amplifiers 102 and 103 can be class B or class C amplifiers.

In an example, the carrier amplifier stage 101 may include one or more power transistors having a first size. The peaking amplifier stage 102 may include one or more power transistors having the first size (e.g., same size as the power transistor of the carrier amplifier stage 101). The peaking amplifier stage 103 may include one or more power transistors having a second size, wherein the second size may be greater than the first size. Thus, the peaking amplifier stage 103 may include a power transistor that is larger in size or gate periphery when compared to the power transistors of the carrier amplifier stage and the peaking stage 102. In an example embodiment, the ratio of the sizes of the transistors in the carrier amplifier stage 101, the peaking amplifier stage 102, and the peaking amplifier stage 103, may be one to one to two (1:1:2). For example, a size of the power transistors implementing the carrier amplifier stage 101 and the peaking amplifier stage 102 may be approximately 4 mm (e.g., the size being gate periphery) and the power transistor implementing the peaking amplifier stage 103 may be approximately 8 mm. The power transistors among the carrier amplifier stage 101, the peaking amplifier stage 102, and the peaking amplifier stage 103, may be Gallium Nitride (GaN) transistors such as gallium nitride metal semiconductor field-effect transistors (GaN MESFET), GaN high-electron-mobility transistor (HEMT), GaN heterostructure field-effect transistor (HFET), Silicon laterally-diffused metal-oxide semiconductor (LDMOS), Silicon Complementary metal-oxide-semiconductor (CMOS), Gallium Arsenide (GaAs) devices, etc.

The circuit 110, or the apparatus 100, may receive an input radio frequency (RF) signal labeled as RF_in. The splitter 112 may be configured to split the input RF signal RF_in into a first split RF signal labeled as RF_1 and an intermediate RF signal labeled as RF_int. The splitter 114 may be configured to split the intermediate RF signal RF_int into a second split RF signal labeled as RF_2 and a third split RF signal labeled as RF_3. The split RF signal RF_1 may be inputted into the carrier amplifier stage 101, the split RF signal RF_2 may be inputted into the peaking amplifier stage 102, and the split RF signal RF_3 may be inputted into the peaking amplifier stage 103. For example, 112 could have a power split ratio of 1:3 while 114 could have a power split ratio of 1:2. In an example, each one of the splitters 112 and 114 may include various components such as power dividers, phase shifters, attenuators, surface mount passive components (e.g., resistors, inductors, capacitors) and/or other types of components to facilitate splitting of RF signals. For example, a phase shifter of the splitter 114 may perform a phase shift on the split RF signal RF_3 to apply a delay 116 on the split RF signal RF_3, where the delay 116 can be implemented by a quarter wave transmission line providing a 90-degree phase shift.

The power being provided by the input RF signal RF_in may determine which one of the carrier amplifier stage 101, the peaking amplifier stage 102, and the peaking amplifier stage 103 may be switched on. In an example, the carrier amplifier stage 101 may be constantly switched on, regardless of the power level of the input RF signal RF_in. As the power level of the input RF signal RF_in increases, the number of amplifier stages being switched on may also increase. For example, a minimum power level of the input RF_in signal may result in a power split causing a power level of RF_1 to be sufficient for switching on the power transistor in the carrier amplifier stage 101 (this stage may be on irrespective of the power input), but the power levels of RF_2 and RF_3 may be insufficient to switch on the power transistors of the peaking amplifier stages 102, 103. In another example, a specific power level, greater than the minimum power level, of the input RF_in signal may result in a power split causing the power levels of RF_1 and RF_2 to be sufficient for switching on the power transistors in the carrier amplifier stage 101 and the peaking amplifier stage 102, respectively, but the power level of RF_3 may be insufficient to switch on the power transistor of the peaking amplifier stages 103. In another example, another specific power level, greater than the minimum power level, of the input RF_in signal may result in a power split causing the power levels of RF_1, RF_2, and RF_3 to be sufficient for switching on the power transistors in the carrier amplifier stage 101 and the peaking amplifier stages 102, 103, respectively. For example, if RF_in is 30 decibel-milliwatt (dBm), or 1 watt (W), then RF_1 is 24 dBm (or 0.25 W), RF_int is 28.8 dBm (or 0.75 W), RF_2 is 24 dBm (or 0.25 W), and RF_3 is 27 dBm (or 0.5 W).

The input matching networks 121, 122, 123, may be configured to perform input impedance matching for the carrier amplifier stage 101, the peaking amplifier stage 102, and the peaking amplifier stage 103, respectively. In an example, each one of the input matching networks 121, 122, 123 may include a respective harmonic trap configured to reduce harmonic currents flowing into the carrier amplifier stage 101, the peaking amplifier stage 102, and the peaking amplifier stage 103. The impedance matching being performed by the input matching networks 121, 122, 123 may control the RF signals being inputted into each one of the carrier amplifier stage 101, the peaking amplifier stage 102, and the peaking amplifier stage 103. For example, the input matching networks 121, 122, 123 may control power level of the split RF signals RF_1, RF_2, and RF_3, before they are inputted into each one of the carrier amplifier stage 101, the peaking amplifier stage 102, and the peaking amplifier stage 103. The matching networks are used to shape the frequency response of the input signals in addition to impedance matching.

The input matching networks 121, 122, 123 along with the power splitters 112 and 114 work together to maintain a high efficiency performance at backoff state, to match to the power capacity of the power transistors in the carrier amplifier stage 101, the peaking amplifier stage 102, and the peaking amplifier stage 103. The input matching networks 121, 122, 123 along with the circuit 130 keep the power amplifier working at a high backoff efficiency, such that there may be no need for load modulating the carrier 101. Note that GaN transistors tend to have higher power capacity than transistors composed by other materials (e.g., Si). Therefore, using GaN transistors in the carrier amplifier stage 101, the peaking amplifier stage 102, and the peaking amplifier stage 103, may result in outputting RF signals of higher power. For example, the total output power could be 52 dBm (or 158.4 W) and the topology being implemented by the apparatus 100 could give high efficiency (e.g., close to 78.5% with perfect harmonic terminations) at a large backoff of approximately 8-10 decibels (dB). The input matching networks 121, 122, 123 may output matched RF signals RF_1m, RF_2m, and RF_3m, to the carrier amplifier stage 101, the peaking amplifier stage 102, and the peaking amplifier stage 103, respectively.

The carrier amplifier stage 101, the peaking amplifier stage 102, and the peaking amplifier stage 103 may receive the matched RF signals RF_1m, RF_2m, and RF_3m from input matching networks 121, 122, 123, respectively. The carrier amplifier stage 101, the peaking amplifier stage 102, and the peaking amplifier stage 103 may amplify the matched RF signals RF_1m, RF_2m, and RF_3m to generate amplified RF signals RF_1a, RF_2a, and RF_3a, respectively. The amplified RF signals RF_1a, RF_2a, and RF_3a may be combined at a node 127 (in the circuit 130) to form a combined RF signal, labeled as RF_C. In an example, the circuit 130 may include resonator circuits connected to the outputs of the carrier amplifier stage 101, the peaking amplifier stage 102, and the peaking amplifier stage 103. For example, resonator circuits 124, 125, 126 may be connected to output terminals of the carrier amplifier stage 101, the peaking amplifier stage 102, and the peaking amplifier stage 103, respectively. In an example embodiment, the resonator circuits 124, 125, 126 can be used for realizing lumped equivalents of quarter wave transmission lines, resonate part of the output capacitances of amplifier stages 101, 102, 103, as well as to provide DC bias to the drain of amplifier stages 101, 102, 103.

In an example, each one of the carrier amplifier stage 101, the peaking amplifier stage 102, and the peaking amplifier stage 103 may amplify a matched RF signal (e.g., RF_1m, RF_2m, and RF_3m) in response to being switched on. For example, if the carrier amplifier stage 101 and the peaking amplifier stage 102 are switched on, but the peaking amplifier stage 103 is switched off, then only RF_1m and RF_2m will be amplified by the carrier amplifier stage 101 and the peaking amplifier stage 102 and the peaking amplifier stage 103 may not output any RF signal.

The combined RF signal RF_C may be provided to a load 104 via a transformer 105. In an example, the load 104 may be an antenna of a phased array, an input of a circulator connected to an antenna. The transformer 105 can be used for matching the impedance of the load 104 (e.g., the antenna) impedance to an output impedance at the combining node 127 in order to achieve maximum power transfer. The circuit 130 may be relatively compact (e.g., having less components and footprint) when compared to conventional output networks that may require addition components and/or footprint to perform load modulation. Further, the circuit 130 provides a combining network that does not perform load modulation, such that a relatively wide bandwidth of the output RF signal RF_out may be achieved. For example, traditional load modulated power amplifiers rely on modifying the load of the carrier power amplifier from a high efficiency state to a high power state. Typically, the high efficiency state is more frequency dispersive compared to the high power state. For larger backoff efficiency requirement, this modulation range could be very high, such as a 3:1 load modulation, or a 4:1 load modulation. Thus, the frequency can be limited. The apparatus 100 allows the carrier amplifier stage 101 and the peaking stage 102 to be matched to a 2:1 impedance without load modulation, thus achieving similar high backoff efficiency at a lower impedance transformation, effectively increasing the bandwidth.

Figure 2:
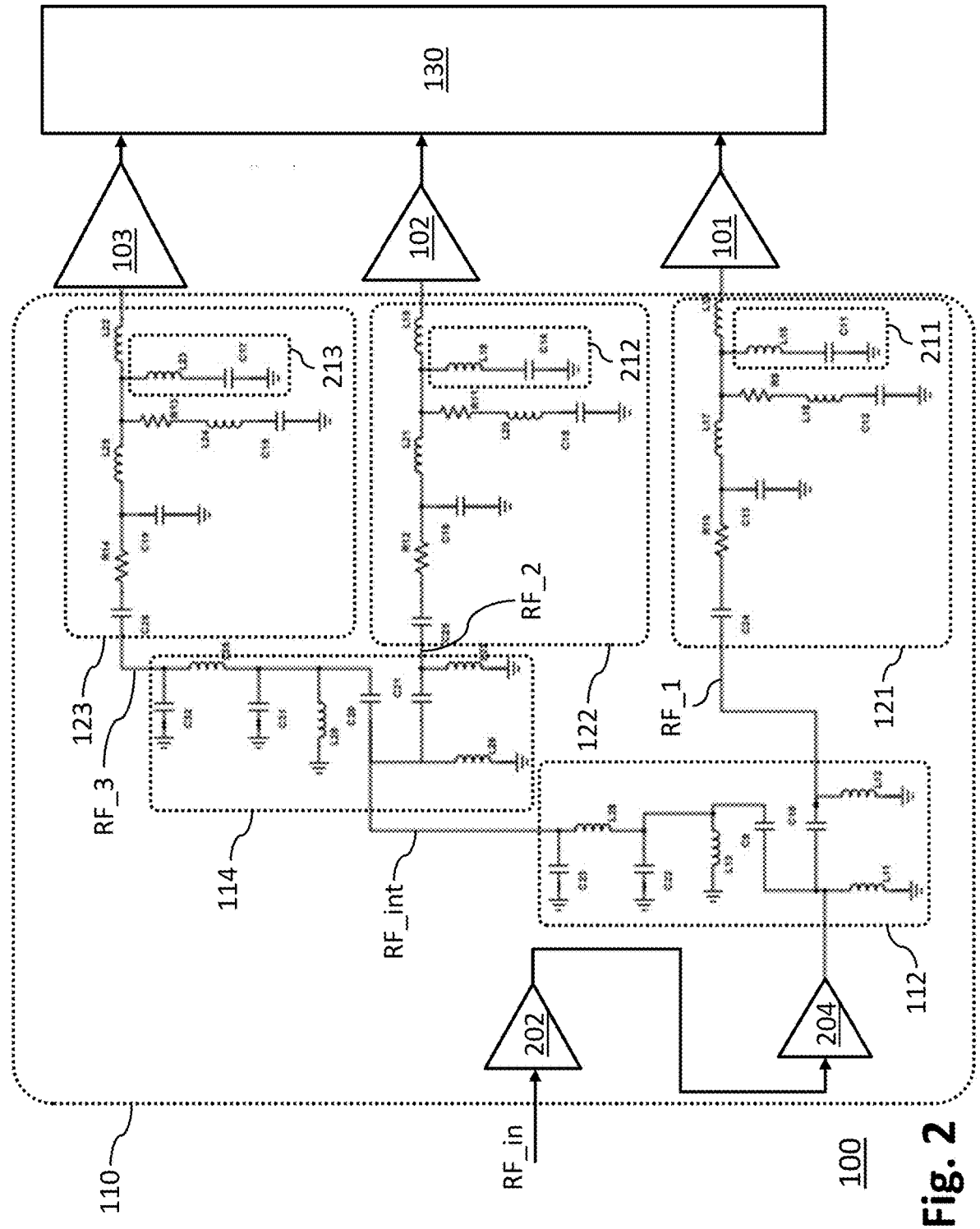
FIG. 2 is a diagram showing additional details of the example apparatus shown in FIG. 1 in one embodiment.

FIG. 2 is a diagram showing additional details of the example apparatus shown in FIG. 1 in one embodiment. In the example shown in FIG. 2, the circuit 110 may further include a predriver 202 and a driver 204. In an example, the predriver 202 and the driver 204 may be configured to amplify the signal being supplied by the input RF signal RF_in, and may adjust various attributes of the input RF signal RF_in (such as frequency response) to optimize input RF signal RF_in before inputting RF_in into the splitter 112. The input matching networks 121, 122, 123 may include various discrete components, such as resistors, inductors, capacitors, that may adjust power levels of the split RF signals RF_1, RF_2, RF_3 as well as their frequency response. The input matching networks 121, 122, 123 may include harmonic traps 211, 212, 213, that may be configured to engineer or optimize harmonic currents flowing into the carrier amplifier stage 101, the peaking amplifier stage 102, and the peaking amplifier stage 103, respectively. In an embodiment, the splitters 112 and 114 are discrete implementation of the blocks 112 and 114 shown in FIG. 1. The component values are chosen to achieve the correct power split over the amplifier's bandwidth. The matching networks 121, 122, 123 can provide a band-pass response to the input of the amplifier stages 101, 102 and 103 respectively.

Figure 3:
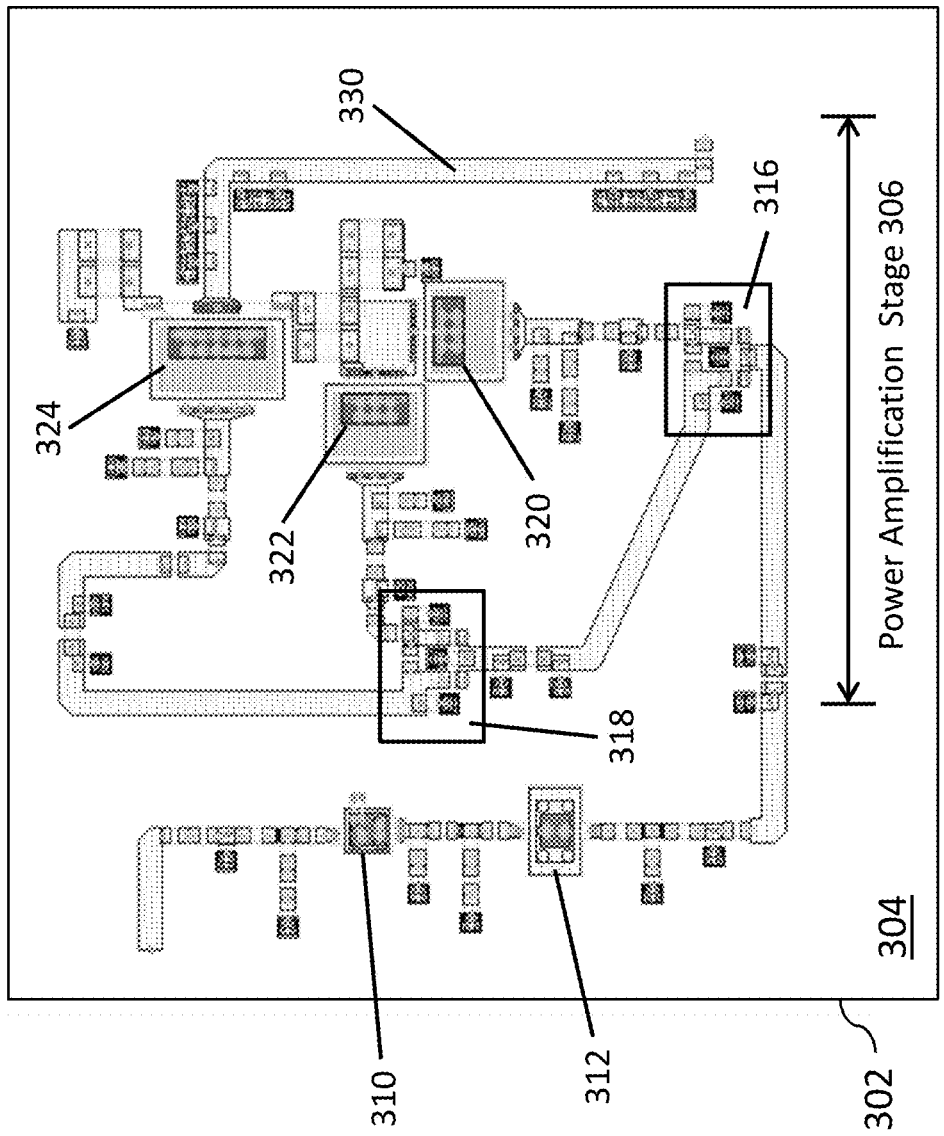
FIG. 3 is a diagram showing a top layer of an amplifier module that can implement three-way combined RF power amplifier architecture in one embodiment.

FIG. 3 is a diagram showing a top layer of an amplifier module that can implement three-way combined RF power amplifier architecture in one embodiment. The top layer of the amplifier module 300 shown in FIG. 3 may be a semiconductor packaged device that can be embedded or integrated onto another device. The amplifier module 300 may include a substrate 302 and the substrate 302 may include a mounting surface 304 for mounting various circuit elements. A gain stage 310 having predriver elements can represent the predriver 202 shown in FIG. 2, where the gain stage 310 is mounted on the mounting surface 304. A gain stage 312 having driver elements can represent the driver 204 shown in FIG. 2, where the gain stage is mounted on the mounting surface 304. A splitter element 316 representing the splitter 112, shown in FIG. 1 and FIG. 2, is mounted on the mounting surface 304. A splitter element 318 representing the splitter 114, shown in FIG. 1 and FIG. 2, is mounted on the mounting surface 304. A transformer element 330 representing the transformer 105 shown in FIG. 1 is mounted on the mounting surface 304.

A carrier amplifier die 320 representing the carrier amplifier stage 101, shown in FIG. 1 and FIG. 2, is mounted on the mounting surface 304. A peaking amplifier die 322 representing the peaking amplifier stage 102, shown in FIG. 1 and FIG. 2, is mounted on the mounting surface 304. A peaking amplifier die 324 representing the peaking amplifier stage 103, shown in FIG. 1 and FIG. 2, is mounted on the mounting surface 304. Note that the peaking amplifier die 324 is relatively larger in size when compared with the carrier amplifier die 320 and the peaking amplifier die 322. Also, the carrier amplifier die 320 and the peaking amplifier die 322 have approximately the same size.

The splitter elements 316, 318, the carrier amplifier die 320, the peaking amplifier die 322, and the peaking amplifier die 324, may form an amplification stage 306 of the amplifier module 300. In an example, the carrier amplifier die 320, the peaking amplifier die 322, and the peaking amplifier die 324, may be oriented in a nonparallel manner such that directions of some portions of the signal paths through the carrier amplifier die 320, the peaking amplifier die 322, and the peaking amplifier die 324 are also nonparallel. By orienting the carrier amplifier die 320, the peaking amplifier die 322, and the leaking amplifier die 324 in a nonparallel manner, coupling between the nonparallel portions of the signal paths may be reduced.

In an example, each one of the carrier amplifier die 320, the peaking amplifier die 322, and the peaking amplifier die 324, may be monolithic power transistor integrated circuits (ICs) that may produce heat during operation. The substrate 302 may further include electrically and thermally conductive trenches or coins or slugs connected to the carrier amplifier die 320, the peaking amplifier die 322, and the peaking amplifier die 324, to provide heat sinks and ground reference access.

Figure 4:
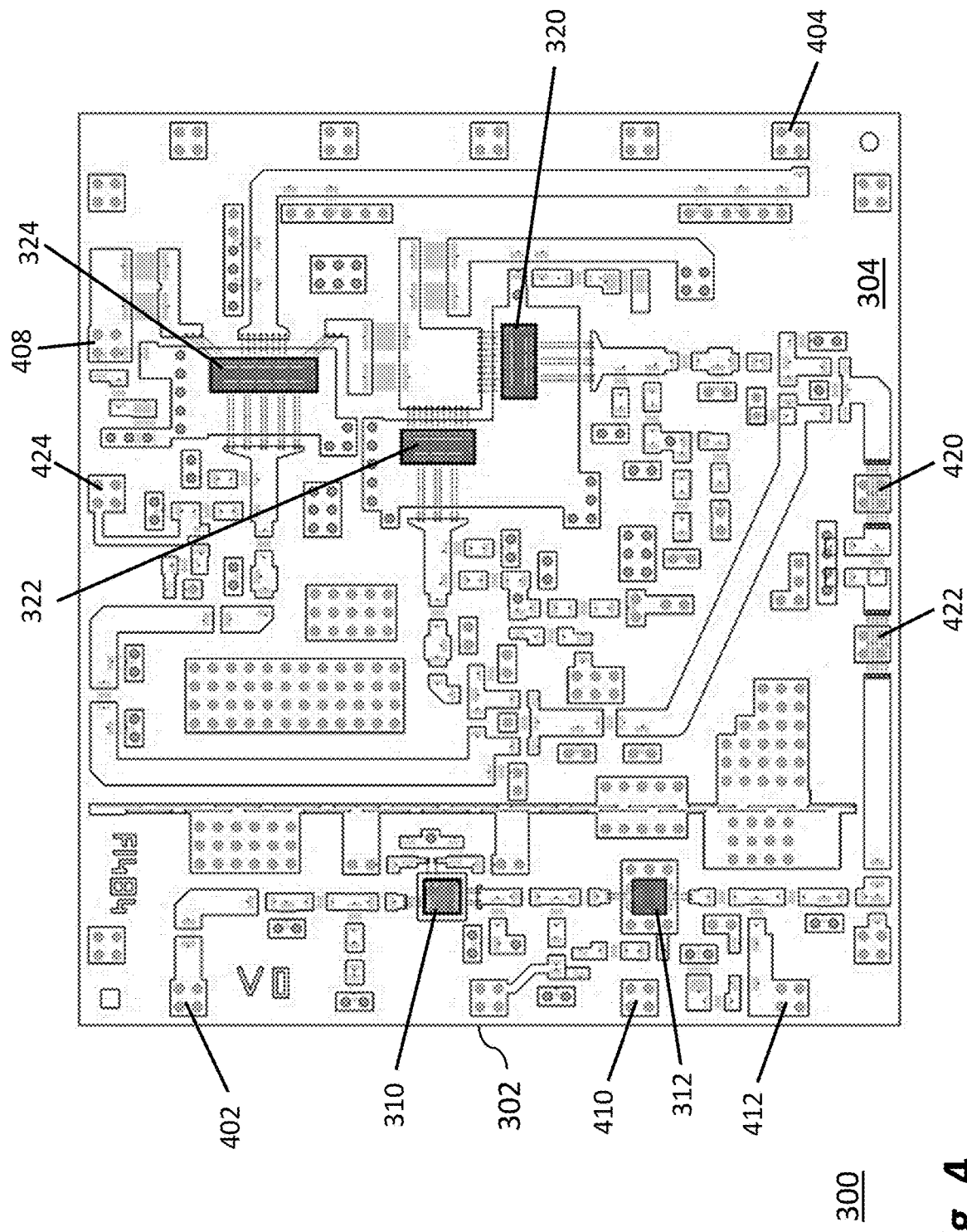
FIG. 4 is a diagram showing the amplifier module of FIG. 3, with additional details, in one embodiment.

FIG. 4 is a diagram showing the amplifier module 300 of FIG. 3, with additional details, in one embodiment. In the example shown in FIG. 4, additional elements are mounted on the mounting surface 304 when compared to the example shown in FIG. 3. For example, a conductive landing pad 402 may function as an input node for the amplifier module 300 to receive the input RF signal RF_in. Another conductive landing pad 404 may function as an output node for the amplifier module 300 to output the output RF signal RF_out.

In another example, various nodes on the mounting surface 304 may be connected to different power supply and may facilitate supplying power to the elements mounted on the mounting surface 304. For example, a node 410 and a node 412 may include conductive contacts to supply power for operating the predriver element 310 and the driver 312, respectively. In another example, a node 420, a node 422, and a node 424 may include conductive contacts to supply power for operating the carrier amplifier die 320, the peaking amplifier die 322, and the peaking amplifier die 324, respectively. Another node 408 may include conductive contacts to supply power to the entire amplifier module 300.

Figure 5:
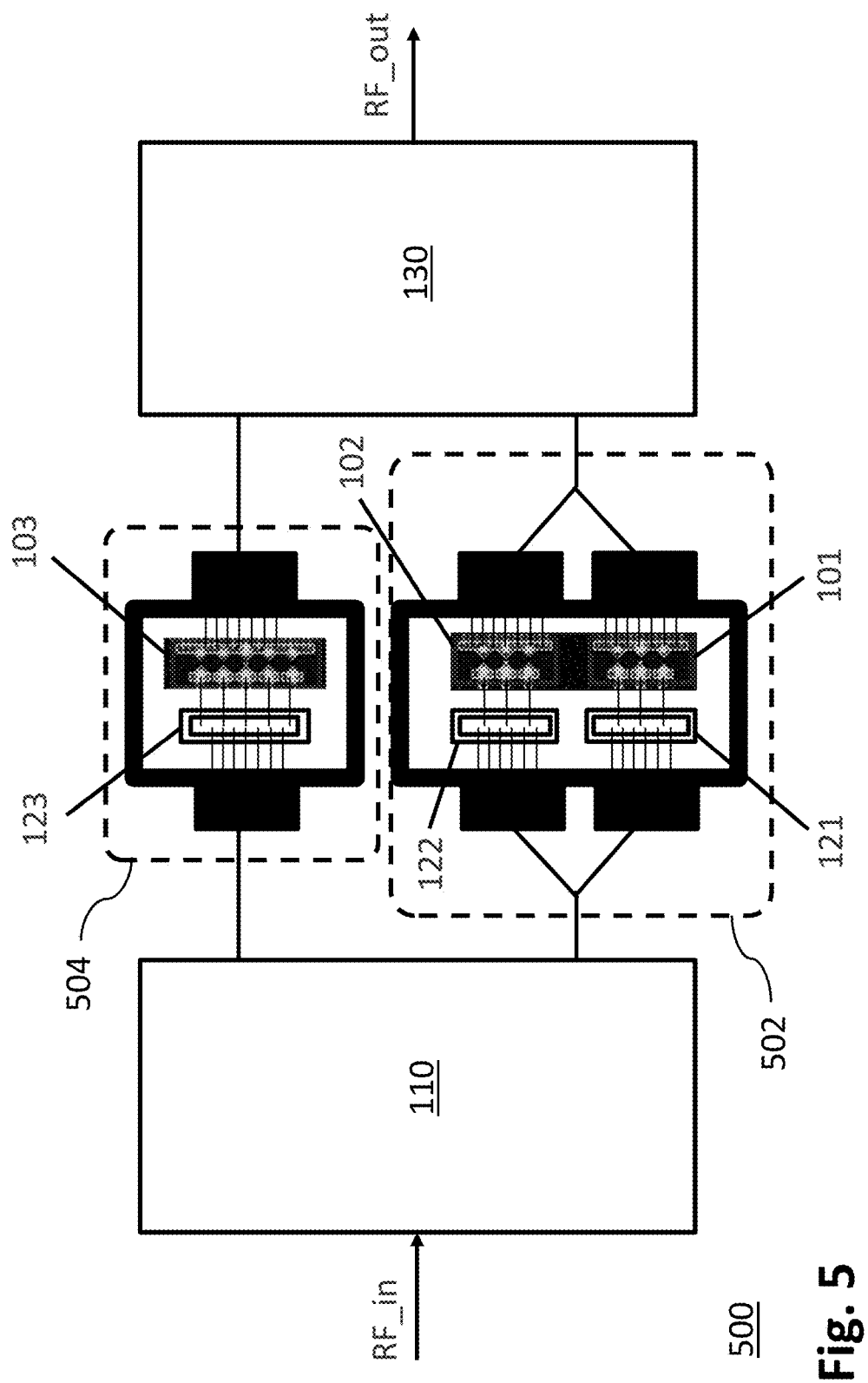
FIG. 5 is a diagram showing an example system that can implement three-way combined RF power amplifier architecture in one embodiment.

FIG. 5 is a diagram showing an example system 500 that can implement three-way combined RF power amplifier architecture in one embodiment. The system 500 may be a discrete implementation of the system 100 shown in FIG. 1. The system 500 may include the circuit 110, the circuit 130, and packaged devices 502, 504 that may be semiconductor packages. The packaged devices 502, 504 may be semiconductor packages including one or more semiconductor devices or integrated circuits. For example, the packaged device 502 may include the carrier amplifier stage 101, the peaking amplifier stage 102, the input matching network 121, and the input matching network 122. The packaged device 504 may include the peaking amplifier stage 103 and the input matching network 123. The packaged device 502 may be implemented as a dual-path discrete packaged transistor device with identical transistors and input prematch (e.g., matching by the input matching networks 121, 122). The packaged device 504 may be implemented as a single-path discrete packaged transistor device with input pre-match (e.g., matching by the input matching network 123). In an example, the system 500 may be formed by mounting the circuit 110, the circuit 130, and the packaged devices 502, 504 on a printed circuit board (PCB).

Figure 6:
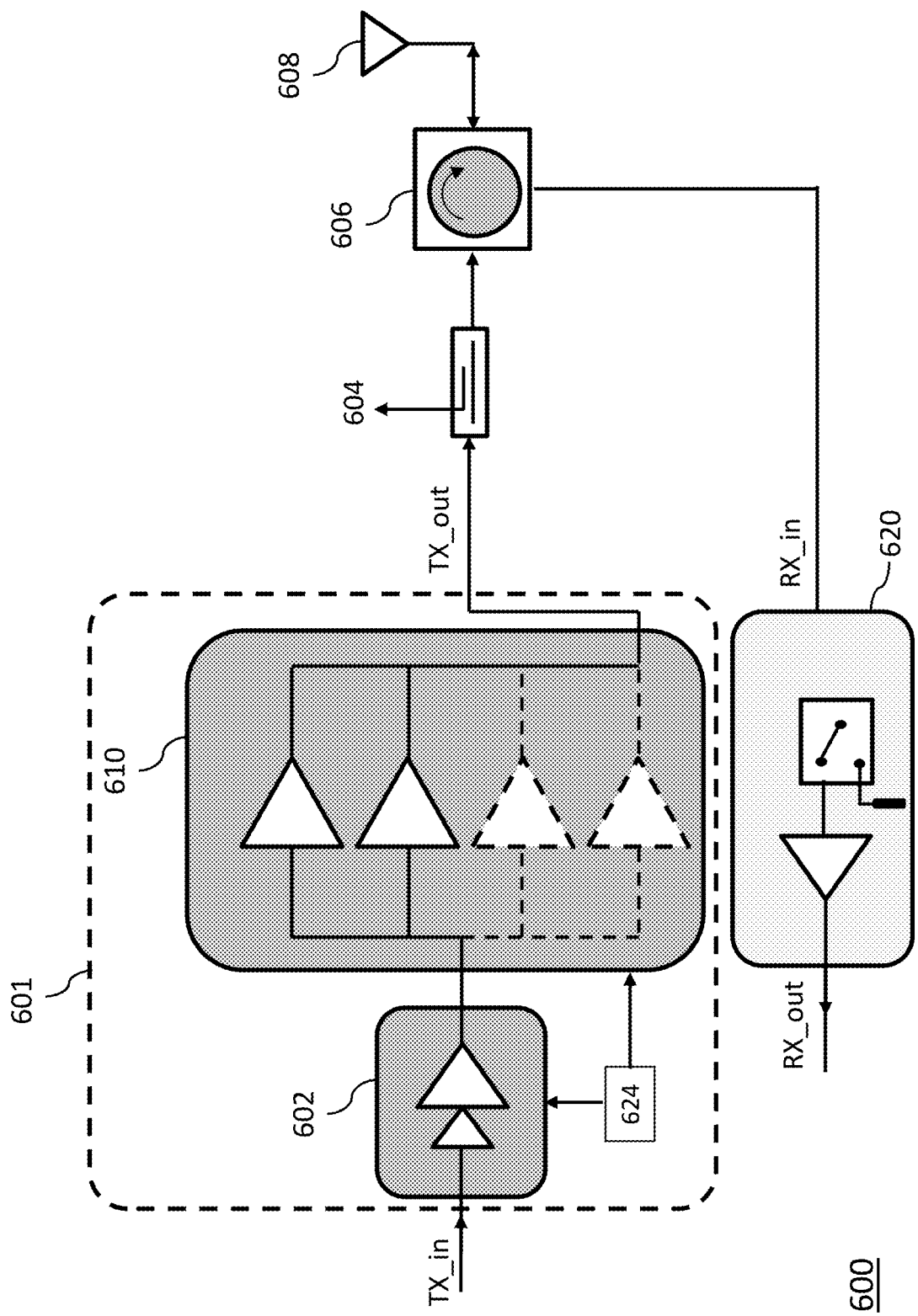
FIG. 6 is a diagram showing an example communication system that can implement three-way combined RF power amplifier architecture in one embodiment.

FIG. 6 is a diagram showing an example communication system 600 that can implement three-way combined RF power amplifier architecture in one embodiment. The communication system 600 may be implemented in a transceiver that includes a transmitter 601 and a receiver 620, where the transmitter 601 can include a circuit 602 and an amplifier module 610. The transmitter 601 may be configured to receive an input RF signal labeled as TX_in. The transmitter 601 may include a front-end circuit including control components, such as gain control circuits and phase control circuits that may adjust a gain and phase of the input RF signal TX_in prior to being amplified. An amplification stage of the communication system 600 may include an amplifier module 610. The amplifier module 610 may include N amplifier stages, and may be configured to amplify the input RF signal TX_in to generate amplified RF signal labeled as TX_out. In an example, when N=3, the amplifier 610 may implement the apparatus 100 shown in FIG. 1 and FIG. 2, or the amplifier module 300 shown in FIG. 3 and FIG. 4, to provide amplification using approaches that may include power splitting, input impedance matching for specifically sized power transistors (e.g., that may be GaN transistors), and without using load modulation. The system 600 may further include a circuit 624 connected between the transmitter 602 and the amplifier module 610, where the circuit 624 may be configured to provide power amplifier bias control for the amplifier module 610 and/or switching and temperature compensations.

The amplified RF signal TX_out may be sent to an antenna 608. In an example, the amplified RF signal TX_out may be fed back to, for example, the transmitter 602 or other controllers, as a feedback signal 604. In an embodiment, the apparatus 600 is typically connected in a loop with a system known as a digital predistortion system. The feedback signal 604 can be provided to the digital predistortion system to monitor the output of the apparatus 600, and the digital predistortion system will process the feedback signal 604 to adjust its level, amplitude, phase, bandwidth, etc., in order to maintain and stabilize performance of the antenna. A circulator 606 can be connected between the output of the transmitter 601 and the antenna 608. The circulator 606 can be used for preventing damages to the antenna, such as redirecting current flowing to or from the antenna 608 in response to a transmit or receiver mode being activated for the apparatus 600. In an example, the circulator 606 may be switched to connect the output of the amplifier module 610 to the antenna 608 when the communication system 600 is operating in a transmission mode. When the communication system is operating in a receiving mode, the circulator 606 may be switched to connect the antenna 608 to the receiver 620. In the receiving mode, the antenna 608 may receive a RF signal labeled as RX_in, and the receiver 620 may be configured to process the RF signal RX_in, such as determining a phase, receiving angle, amplitude, etc., of the RF signal RX_in to generate a received RF signal labeled as RX_out.

Figure 7:
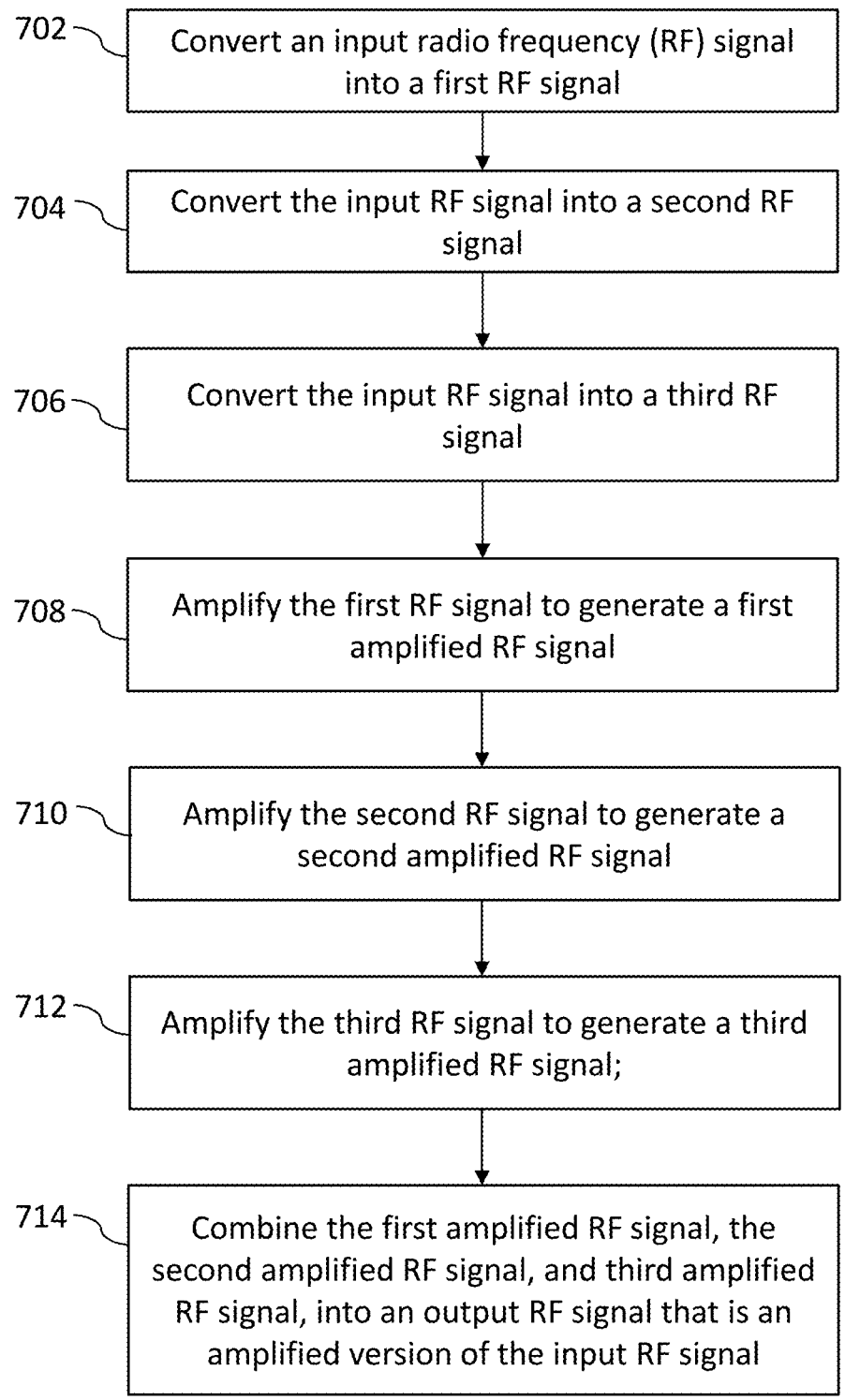
FIG. 7 is a flow diagram illustrating a process of implementing three-way combined RF power amplifier architecture in one embodiment.

FIG. 7 is a flow diagram illustrating a process 700 of implementing three-way combined RF power amplifier architecture in one embodiment. The process 700 in FIG. 7 may be implemented using, for example, the apparatus 100 discussed above. An example process may include one or more operations, actions, or functions as illustrated by one or more of blocks 702, 704, 706, 708, 710, 712, and/or 714. Although illustrated as discrete blocks, various blocks may be divided into additional blocks, combined into fewer blocks, eliminated, performed in different order, or performed in parallel, depending on the desired implementation.

The process 700 can begin at block 702. At block 702, an apparatus can convert an input radio frequency (RF) signal into a first RF signal. The first RF signal can have a first power level that matches a power capacity of a first transistor of a first size in a carrier amplifier stage. The process 700 can proceed from block 702 to block 704. At block 704, the apparatus can further convert the input radio frequency (RF) signal into a second RF signal. The second RF signal can have a second power level that matches a power capacity of a second transistor of the first size in a first peaking amplifier stage. The process 700 can proceed from block 704 to block 706. At block 706, the apparatus can further convert the input radio frequency (RF) signal into a third RF signal. The third RF signal can have a third power level that matches a power capacity of a third transistor of a second size in a second peaking amplifier stage. In an embodiment, the first size can be less than the second size. In another embodiment, a ratio of the first size to the second size can be one to two. In another embodiment, the first transistor, the second transistor, and the third transistor can be Gallium Nitride (GaN) transistors.

In an embodiment, the conversion of the input RF signal into the first RF signal, the second RF signal, and the third RF signal can include splitting the input RF signal into a first split RF signal and an intermediate RF signal, and splitting the intermediate RF signal into a second split RF signal and a third split RF signal. In an embodiment, the apparatus can further reduce harmonics of the first split RF signal, the second split RF signal, and the third split RF signal, using harmonics traps. The apparatus can further adjust a power level of the first split RF signal to the first power level to generate the first RF signal, adjust a power level of the second split RF signal to the second power level to generate the second RF signal, and adjust a power level of the third split RF signal to the third power level to generate the third RF signal.

The process 700 can proceed from block 706 to block 708. At block 708, the apparatus can further amplify the first RF signal to generate a first amplified RF signal. The process 700 can proceed from block 708 to block 710. At block 710, the apparatus can further amplify the second RF signal to generate a second amplified RF signal. The process 700 can proceed from block 710 to block 712. At block 712, the apparatus can further amplify the third RF signal to generate a third amplified RF signal. The process 700 can proceed from block 712 to block 714. At block 714, the apparatus can further combine the first amplified RF signal, the second amplified RF signal, and third amplified RF signal, into an output RF signal that is an amplified version of the input RF signal.

Figure 8:
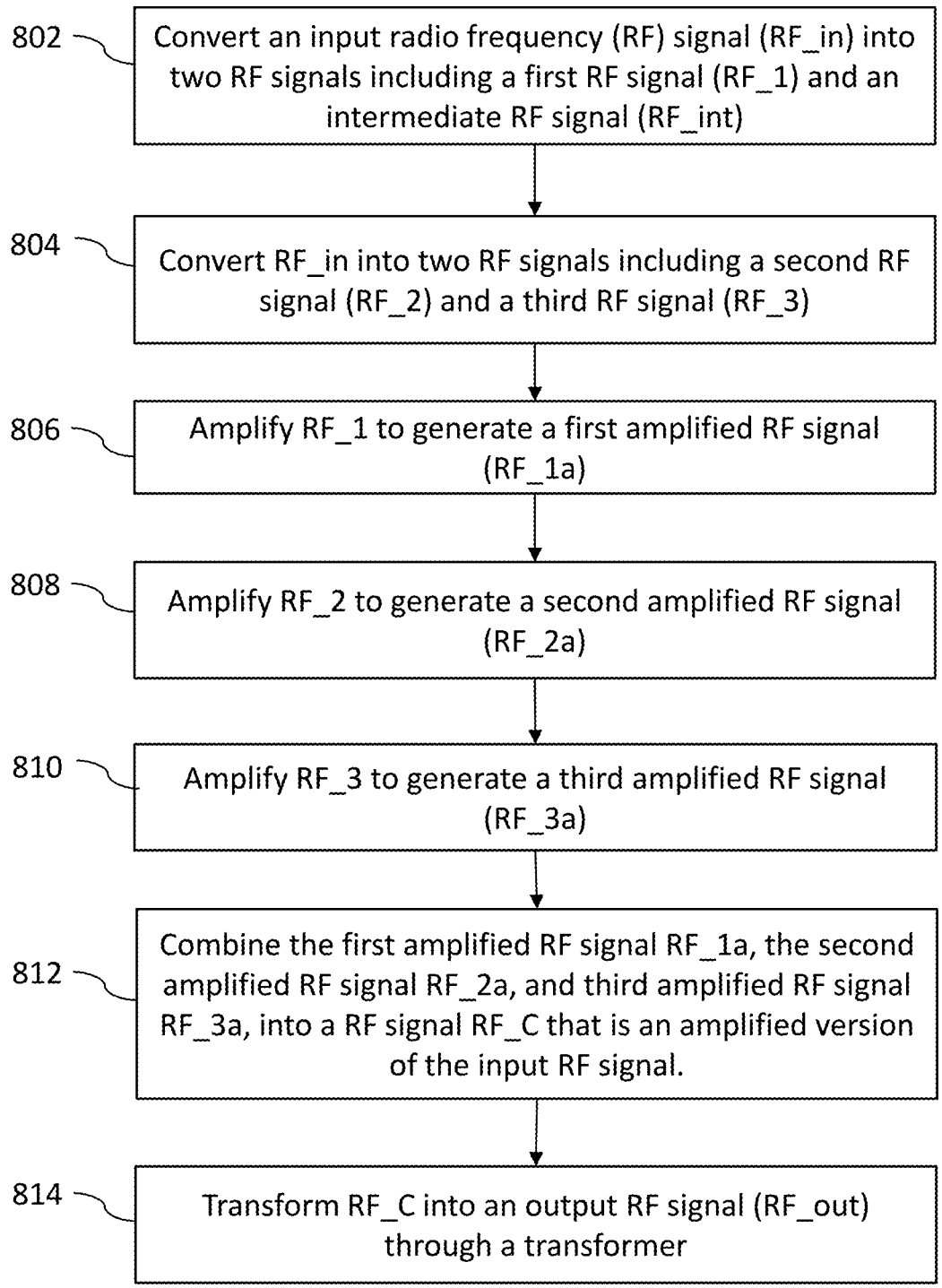
FIG. 8 is a flow diagram illustrating another process of implementing three-way combined RF power amplifier architecture in one embodiment.

FIG. 8 is a flow diagram illustrating another process 800 of implementing three-way combined RF power amplifier architecture in one embodiment. The process 800 in FIG. 8 may be implemented using, for example, the apparatus 100 discussed above. An example process may include one or more operations, actions, or functions as illustrated by one or more of blocks 802, 804, 806, 808, 810, 812, and/or 814. Although illustrated as discrete blocks, various blocks may be divided into additional blocks, combined into fewer blocks, eliminated, performed in different order, or performed in parallel, depending on the desired implementation.

The process 800 may reference the items shown in FIG. 1. The process 800 can begin at block 802. At block 802, an apparatus can convert an input radio frequency (RF) signal (RF_in) into two RF signals including a first RF signal (RF_1) and an intermediate RF signal (RF_int). The first RF signal can have a first power level that matches a power capacity of a first transistor of a first size in a carrier amplifier stage. In an embodiment, the conversion of the input RF signal into RF_1 and RF_int can include splitting the input RF signal into RF_1 and RF_int.

The process 800 can proceed from block 802 to block 804. At block 804, the apparatus can convert RF_in into two RF signals including a second RF signal (RF_2) and a third RF signal (RF_3). The second RF signal can have a second power level that matches a power capacity of a second transistor of the first size in a first peaking amplifier stage. The third RF signal can have a third power level that matches a power capacity of a third transistor of a second size in a second peaking amplifier stage. In an embodiment, the conversion of RF_int into RF_2 and RF_3 can include splitting RF_int signal into RF_2 and RF_3. In an embodiment, the first size can be less than the second size. In another embodiment, a ratio of the first size to the second size can be one to two. In another embodiment, the first transistor, the second transistor, and the third transistor can be Gallium Nitride (GaN) transistors.

The process 800 can proceed from block 804 to block 806. At block 806, the apparatus can amplify RF_1 to generate a first amplified RF signal (RF_1a). The process 800 can proceed from block 806 to block 808. At block 808, the apparatus can amplify RF_2 to generate a second amplified RF signal (RF_2a). The process 800 can proceed from block 808 to block 810. At block 810, the apparatus can amplify RF_3 to generate a third amplified RF signal (RF_3a). The process 800 can proceed from block 810 to block 812. At block 812, the apparatus can combine RF_1a, RF_2a, RF_3a into a RF signal (RF_C) that is an amplified version of RF_in. The process 800 can proceed from block 812 to block 814. At block 814, the apparatus can transform RC_C into an output RF signal (RF_out) through a transformer (e.g., transformer 105 in FIG. 1).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a circuit configured to convert an input radio frequency (RF) signal into a first RF signal, a second RF signal, and a third RF signal;
   a carrier amplifier stage including a first transistor of a first size, wherein the first RF signal has a first power level that matches a power capacity of the first transistor, and the carrier amplifier stage is configured to amplify the first RF signal to generate a first amplified RF signal;
   a first peaking amplifier stage including a second transistor of the first size, wherein the second RF signal has a second power level that matches a power capacity of the second transistor, and the first peaking amplifier stage is configured to amplify the second RF signal to generate a second amplified RF signal; and
   a second peaking amplifier stage including a third transistor of a second size different from the first size, wherein the third RF signal has a third power level that matches a power capacity of the third transistor, and the second peaking amplifier stage is configured to amplify the third RF signal to generate a third amplified RF signal,
   wherein the first amplified RF signal, the second amplified RF signal, and third amplified RF signal, are combined into an output RF signal, the output RF signal being an amplified version of the input RF signal, and
   wherein the second size is double the first size such that a gate periphery ratio of the carrier amplifier stage, the first peaking amplifier stage and the second peaking amplifier stage is 1:1:2, and the carrier amplifier stage and the first peaking amplifier stage are impedance matched to a 2:1 ratio.

2. The apparatus of claim 1, wherein:
   the circuit comprises a first splitter, a second splitter, a first matching network, a second matching network, and a third matching network;
   the first splitter being configured to split the input RF signal into a first split RF signal and an intermediate RF signal;
   the second splitter being configured to split the intermediate RF signal into a second split RF signal and a third split RF signal;
   the first matching network being configured to adjust a power level of the first split RF signal to the first power level to generate the first RF signal;
   the second matching network being configured to adjust a power level of the second split RF signal to the second power level to generate the second RF signal; and
   the third matching network being configured to adjust a power level of the third split RF signal to the third power level to generate the third RF signal.

3. The apparatus of claim 2, wherein each one of the first matching network, the second matching network, and the third matching network, includes a respective harmonic trap to reduce harmonics of the first split RF signal, the second split RF signal, and the third split RF signal, respectively.

4. The apparatus of claim 1, further comprising an output network configured to combine the first amplified RF signal, the second amplified RF signal, and third amplified RF signal to generate the output RF signal.

5. The apparatus of claim 1, wherein the first transistor, the second transistor, and the third transistor are Gallium Nitride (GaN) transistors.

6. The apparatus of claim 1, wherein the circuit comprises:
   a first gain stage comprising a predriver configured to perform first amplification on the input RF signal;
   a second gain stage comprising a driver configured to perform second amplification on an output from the first gain stage; and at least one splitter configured to split an output from the second gain stage into the first RF signal, the second RF signal, and the third RF signal.

7. The apparatus of claim 1, wherein the circuit comprises:
a first splitter configured to split the input RF signal into a first split RF signal having a quarter of power level of the input RF signal and an intermediate RF signal having three quarters of the power level of the input RF signal; and
a second splitter configured to split the intermediate RF signal in into a second split RF signal having a quarter of power level of the input RF signal and a third split RF signal having half of the power level of the input RF signal.

8. A method for amplifying a signal, the method comprising:
converting an input radio frequency (RF) signal into a first RF signal having a first power level that matches a power capacity of a first transistor of a first size in a carrier amplifier stage;
converting the input RF signal into a second RF signal having a second power level that matches a power capacity of a second transistor of the first size in a first peaking amplifier stage;
converting the input RF signal into a third RF signal having a third power level that matches a power capacity of a third transistor of a second size in a second peaking amplifier stage;
amplifying the first RF signal to generate a first amplified RF signal;
amplifying the second RF signal to generate a second amplified RF signal;
amplifying the third RF signal to generate a third amplified RF signal;
combining the first amplified RF signal, the second amplified RF signal, and third amplified RF signal, into an output RF signal that is an amplified version of the input RF signal, wherein the second size is double the first size such that a gate periphery ratio of the carrier amplifier stage, the first peaking amplifier stage and the second peaking amplifier stage is 1:1:2, wherein the carrier amplifier stage and the first peaking amplifier stage are impedance matched to a 2:1 ratio.

9. The method of claim 8, wherein converting the input RF signal into the first RF signal, the second RF signal, and the third RF signal comprises:
splitting the input RF signal into a first split RF signal and an intermediate RF signal;
splitting the intermediate RF signal into a second split RF signal and a third split RF signal;
adjusting a power level of the first split RF signal to the first power level to generate the first RF signal;
adjusting a power level of the second split RF signal to the second power level to generate the second RF signal; and
adjusting a power level of the third split RF signal to the third power level to generate the third RF signal.

10. The method of claim 9, further comprising reducing harmonics of the first split RF signal, the second split RF signal, and the third split RF signal, using harmonics traps.

11. The method of claim 8, wherein the first transistor, the second transistor, and the third transistor are Gallium Nitride (GaN) transistors.

12. The method of claim 8, further comprising:
operating a first gain stage to perform first amplification on the input RF signal;
operating a second gain stage to perform second amplification on an output from the first gain stage; and
splitting an output from the second gain stage into the first RF signal, the second RF signal, and the third RF signal.

13. The method of claim 8, further comprising:
splitting the input RF signal into a first split RF signal having a quarter of power level of the input RF signal and an intermediate RF signal having three quarters of the power level of the input RF signal; and
splitting the intermediate RF signal in into a second split RF signal having a quarter of power level of the input RF signal and a third split RF signal having half of the power level of the input RF signal.

14. An apparatus comprising:
a transmitter configured to receive an input RF signal; and
an amplifier connected to the transmitter, wherein the amplifier comprises:
a circuit configured to convert an input radio frequency (RF) signal into a first RF signal, a second RF signal, and a third RF signal;
a carrier amplifier stage including a first transistor of a first size, wherein the first RF signal has a first power level that matches a power capacity of the first transistor, and the carrier amplifier stage is configured to amplify the first RF signal to generate a first amplified RF signal;
a first peaking amplifier stage including a second transistor of the first size, wherein the second RF signal has a second power level that matches a power capacity of the second transistor, and the first peaking amplifier stage is configured to amplify the second RF signal to generate a second amplified RF signal; and
a second peaking amplifier stage including a third transistor of a second size different from the first size, wherein the third RF signal has a third power level that matches a power capacity of the third transistor, and the second peaking amplifier stage is configured to amplify the third RF signal to generate a third amplified RF signal,
wherein the first amplified RF signal, the second amplified RF signal, and third amplified RF signal, are combined into an output RF signal, the output RF signal being an amplified version of the input RF signal, and
wherein the second size is double the first size such that a gate periphery ratio of the carrier amplifier stage, the first peaking amplifier stage and the second peaking amplifier stage is 1:1:2, wherein the carrier amplifier stage and the first peaking amplifier stage are impedance matched to a 2:1 ratio.

15. The apparatus of claim 14, wherein:
the circuit comprises a first splitter, a second splitter, a first matching network, a second matching network, and a third matching network;
the first splitter being configured to split the input RF signal into a first split RF signal and an intermediate RF signal;
the second splitter being configured to split the intermediate RF signal into a second split RF signal and a third split RF signal;
the first matching network being configured to adjust the first split RF signal to generate the first RF signal;
the second matching network being configured to adjust the second split RF signal to generate the second RF signal; and the third matching network being configured to adjust the third split RF signal to generate the third RF signal.

16. The apparatus of claim 15, wherein each one of the first matching network, the second matching network, and the third matching network, includes a respective harmonic trap to reduce harmonics of the first split RF signal, the second split RF signal, and the third split RF signal, respectively.

17. The apparatus of claim 14, further comprising an output network configured to combine the first amplified RF signal, the second amplified RF signal, and third amplified RF signal to generate the output RF signal.

18. The apparatus of claim 14, wherein the first transistor, the second transistor, and the third transistor are Gallium Nitride (GaN) transistors.

19. The apparatus of claim 14, wherein the circuit comprises:
a first gain stage comprising a predriver configured to perform first amplification on the input RF signal;
a second gain stage comprising a driver configured to perform second amplification on an output form the first gain stage; and
at least one splitter configured to split an output from the second gain stage into the first RF signal, the second RF signal, and the third RF signal.

20. The apparatus of claim 14, wherein the circuit comprises:
a first splitter configured to split the input RF signal into a first split RF signal having a quarter of power level of the input RF signal and an intermediate RF signal having three quarters of the power level of the input RF signal; and
a second splitter configured to split the intermediate RF signal in into a second split RF signal having a quarter of power level of the input RF signal and a third split RF signal having half of the power level of the input RF signal.

* * * * *